US006483421B1

(12) United States Patent
Eichelmann

(10) Patent No.: US 6,483,421 B1
(45) Date of Patent: Nov. 19, 2002

(54) CARRIER SUBSTRATE WITH A RESISTOR TRACK

(75) Inventor: Claus Eichelmann, Florstadt (DE)

(73) Assignee: Siemens VDO Automotive AG (DE)

(*) Notice: Subject to any disclaimer, the term of this patent is extended or adjusted under 35 U.S.C. 154(b) by 0 days.

(21) Appl. No.: 09/434,263

(22) Filed: Nov. 5, 1999

(30) Foreign Application Priority Data

May 11, 1998 (DE) ........................................ 198 50 936

(51) Int. Cl.[7] ................................................ H01L 10/32

(52) U.S. Cl. .......................... 338/162; 185/195; 29/620

(58) Field of Search ................................ 338/195, 309, 338/33, 162, 185; 29/610.1, 620

(56) References Cited

U.S. PATENT DOCUMENTS 3,161,850 A * 12/1964 Klug .......................... 338/195
3,983,528 A * 9/1976 King .......................... 338/195
4,134,096 A * 1/1979 Denes ........................ 338/195
4,774,492 A * 9/1988 Shier .......................... 338/309
4,931,764 A 6/1990 Gaston
5,051,719 A 9/1991 Gaston et al.
5,206,623 A * 4/1993 Rochette et al. ............ 338/203
5,243,318 A * 9/1993 Greenstein .................. 338/195

FOREIGN PATENT DOCUMENTS

DE 3227805 A1 7/1982

* cited by examiner

*Primary Examiner*—Karl D. Easthom
(74) *Attorney, Agent, or Firm*—Mayer, Brown, Rowe & Maw

(57) ABSTRACT

A carrier substrate has a resistor track for a slider of a level sensor. The resistor track comprises numerous metal strips which are aligned transversely with respect to the main direction in which said resistor track extends and run at a distance from one another. Regions of metal strips have extensions toward one side of the resistor track which are bridged by an adjusting resistor. The adjusting resistor is designed for isolating resistor regions by cuts running transversely with respect to the extensions.

6 Claims, 2 Drawing Sheets

CARRIER SUBSTRATE WITH A RESISTOR TRACK

BACKGROUND OF THE INVENTION

1. Field of the Invention

The present invention is directed to a carrier substrate with a resistor track for an electrical device in which a slider for providing the connection with electrical energy is movable along the resistor track and the resistor track comprises numerous metal strips which are aligned transversely with respect to the main direction in which said resistor track extends. These elements are located at a distance from one another and are interconnected on one side by a defined, electrical resistor, in particular for a potentiometer of a lever sensor for the level indication in a fuel tank.

2. Description of the Related Art

Carrier substrates of the above type are used for level sensors in fuel tanks of modem motor vehicles and are therefore generally known. There are, however, numerous other applications for which electrical energy also has to be picked up from a resistor track by means of a slider and fed to a moving component.

In the case of level sensors, the aim is usually to achieve linearity between the filling level and the displacement of the level-indicating indicator. Since, however, the cross section of tanks in which the filling level is measured often varies considerably over the height of the tank, in order to adapt to spatial conditions of the motor vehicle, producing this linearity requires sophisticated calibration. In the case of the level sensors known thus far, the individual metal strips are interconnected on one side by a resistor surface bridging them. For changing the resistance of the resistor track, the resistor surface between the metal strips is cut into radially to differing extents, so that the electric current has to flow over a more or less wide remaining width of the resistor surface from one metal strip to the other. The cutting into the resistor surface is currently carried out by means of laser light. If it is desired to use this technique to calibtrate a level sensor in such a way that a linear characteristic is obtained, the number of laser cuts required would be increased by about tenfold, which would mean that a high computer capacity would be required for automatic calibration and that the positioning accuracy of the laser would have to meet undesirably high requirements in order that the tolerances do not accumulate impermissibly from one laser cut to the next.

SUMMARY OF THE INVENTION

The invention is based on the problem of developing a carrier substrate with a resistor track which can be calibrated with as little effort as possible in such a way that a linear characteristic can be achieved for the indication of a device operating with such a resistor track.

This problem is solved according to the invention by regions of metal strips having extensions toward one side of the resistor track which are bridged by an adjusting resistor and by the adjusting resistor being designed for isolating resistor regions by cuts running transversely with respect to the extensions.

Such a design makes it possible to isolate resistor regions with relatively little effort and, as a result, change the electrical resistance in the respectively chosen regions specifically for the entire region, by isolating more or less wide resistor regions. Since the calibration takes place in the region of the extensions, the calibrating regions can be arranged on the printed circuit board without any problem and do not influence the movements of the slider.

It is particularly cost-effective if the adjusting resistor is produced on the extensions by printing thereon and the cuts are formed by means of laser light.

The calibration can be carried out by isolating previously defined individual resistors in fixed calibrating steps and therefore with particularly little computer effort if the adjusting resistor comprises a plurality of resistor tracks running transversely with respect to the extensions.

However, stepless calibration is also possible if, according to another development of the invention, the adjusting resistor forms a closed surface printed onto the extensions.

BRIEF DESCRIPTION OF THE DRAWINGS

The invention allows various embodiments. To illustrate its basic principle further, one of these is represented schematically in the drawing and is described below. In the drawings.

DETAILED DESCRIPTION OF THE PREFERRED EMBODIMENTS

Figure 1:
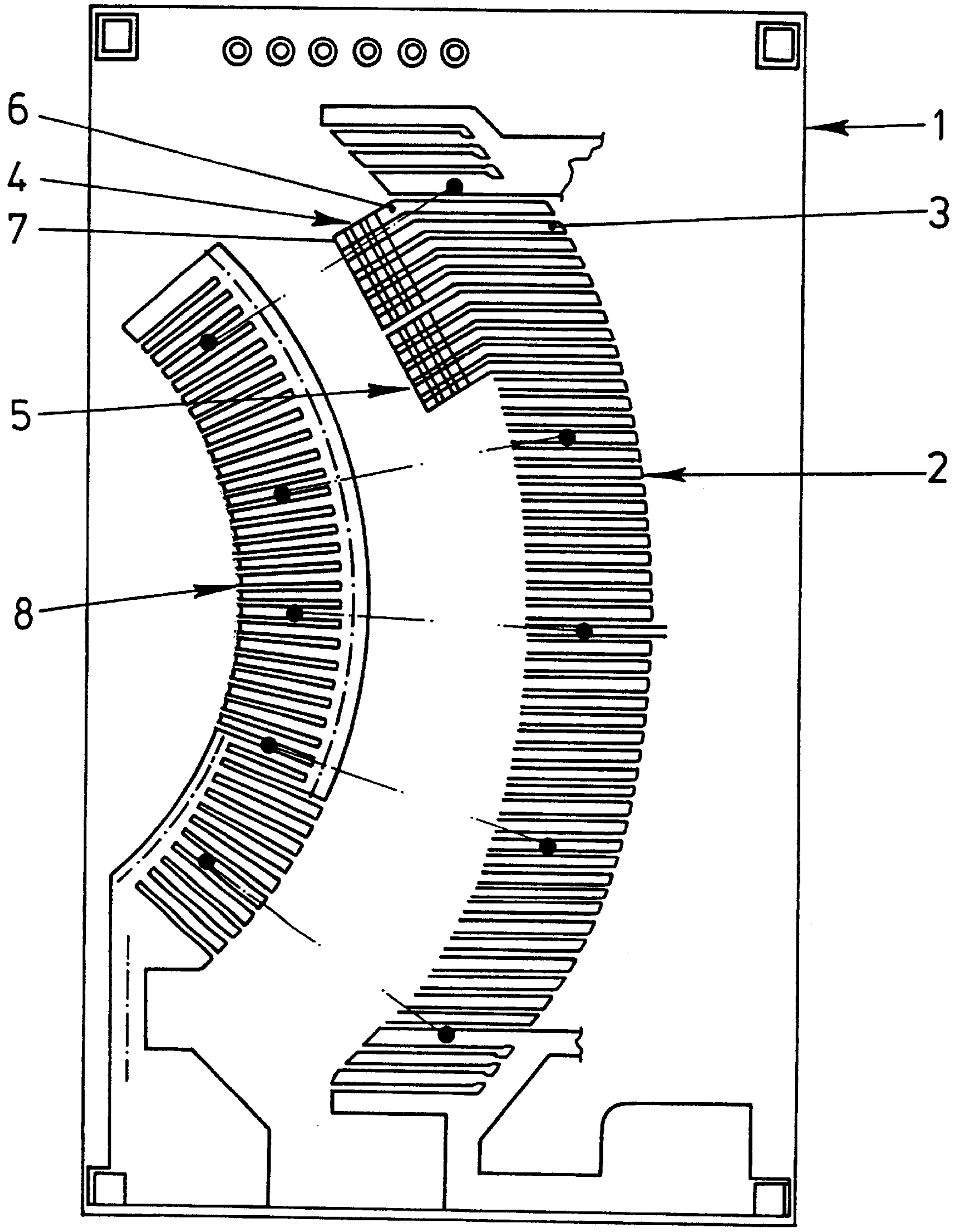
FIG. 1 illustrates a plan view of a printed circuit board according to the invention of a level sensor for a fuel tank.

FIG. 1 shows a carrier substrate 1, which is designed as a printed circuit board or as a ceramic substrate. Arranged on the carrier substrate 1 is a resistor track 2, which is formed by individual metal strips 3 which are arranged next to one another, at a small distance from one another, and serve as resistor tracks. As shown for two regions 4, 5, the metal strips 3 in each case have an extension 6. These extensions 6 of the individual regions 4, 5 are interconnected by adjusting resistors 7 running parallel to one another.

Running coaxially with respect to the resistor track 2 on the printed circuit board 1 is a slider track 8. Not shown is a slider, which slides over the resistor track 2 and the slider track 8 in a way corresponding to the movements of a lever which is pivotably mounted and provided with a float, as a result of which it connects said tracks to each other and generates a signal corresponding to the filling level in the fuel tank.

Figure 2:
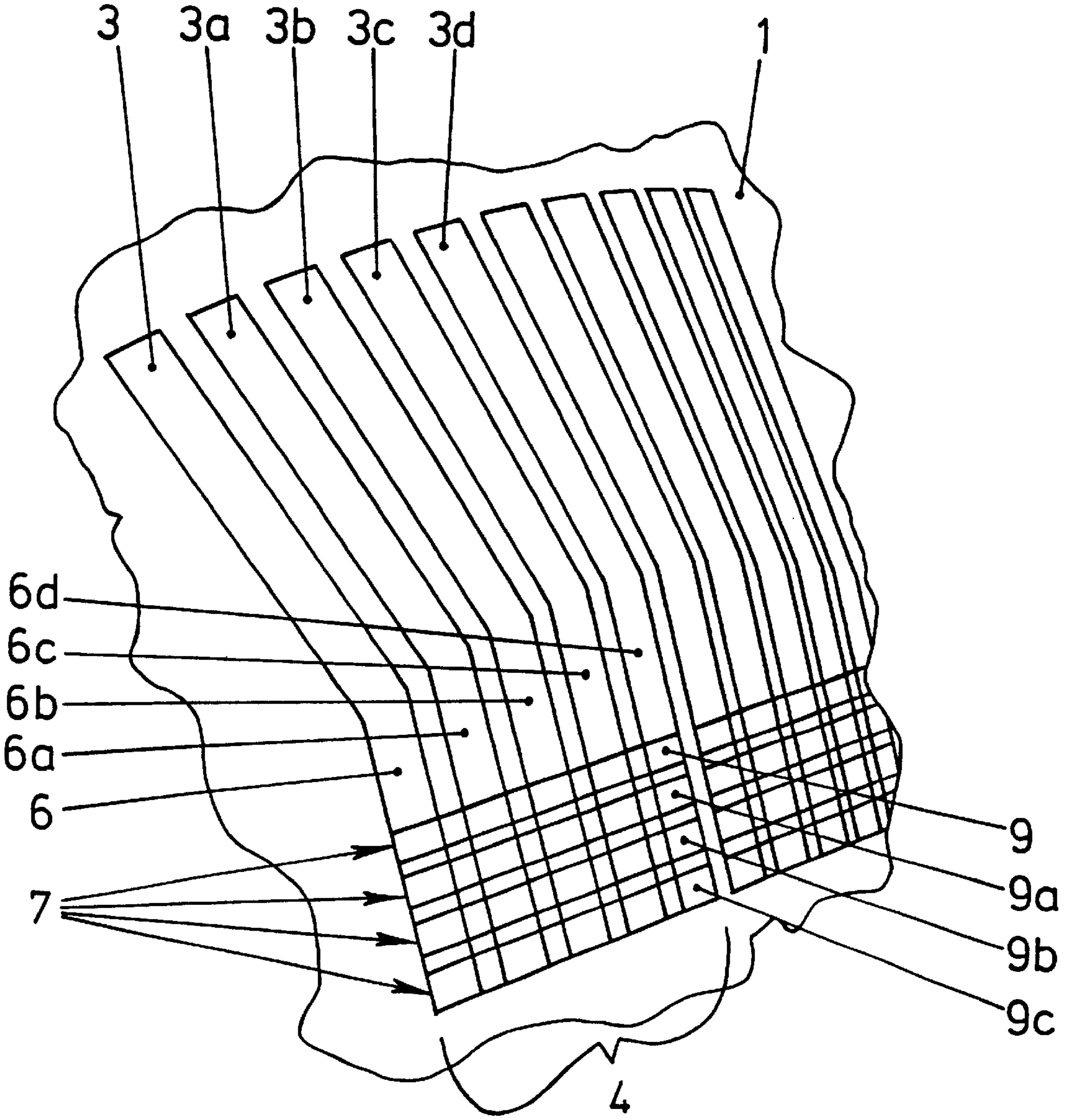
FIG. 2 illustrates a plan view on an enlarged scale in comparison with FIG. 1 of a subregion of the printed circuit board.

FIG. 2 illustrates that five metal strips 3, 3*a*, 3*b*, 3*c*, 3*d* are grouped together to form the region 4 and their respective extensions 6, 6*a*, 6*b*, 6*c*, 6*d* are interconnected by the adjusting resistor 7, which in this example comprises four parallel-running resistor tracks 9, 9*a*, 9*b*, 9*c* at a distance from one another.

The resistor tracks 9, 9*a*, 9*b*, 9*c* connect the metal strips 3, 3*a*, 3*b*, 3*c*, 3*d* to one another via the extensions 6. The electric current flows from one metal strip 3 to the other via these resistor tracks 9, 9*a*, 9*b*, 9*c*. If it is desired to increase the electrical resistance to be overcome in this case, laser light is used for example to cut through the extensions 6 before the lowermost resistor track 9*c*, as seen in FIG. 2. If the resistance is to be increased further, the extensions 6 are for example cut through before the resistor tracks 9*b* or 9*a*.

We claim:

1. A variable resistance position sensor comprising:

a plurality of spaced apart metal strips formed on a substrate and aligned transversely with respect to a path of a contact member, a contact member, each of said plurality of metal strips in contact with a resistive material, a slider track aligned transversely with respect to the path of the contact member, the slider track having a defined longitudinal width and being located in parallel to the plurality of spaced apart metal strips, wherein the contact member is in electrical contact with the slider track and the plurality of metal strips over its path, wherein a group of said plurality of metal strips have strip extensions extending from at least one side of said strips, adjacent ones of said extensions being connected by adjusting resistors and wherein a plurality of said strip extensions intersect with corresponding ones of said metal strips.

2. The carrier substrate as claimed in claim 1, wherein the adjusting resistors are produced on the extensions by printing thereon and the cuts are formed by means of laser light.

3. The carrier substrate as claimed in claim 2, wherein the adjusting resistors are comprised of a plurality of resistor tracks running transversely with respect to the extensions.

4. The carrier substrate as claimed in claim 2, wherein the adjusting resistors form a closed surface printed onto the extensions.

5. A method of adjusting a resistance in a variable resistance position sensor comprising the steps of:

providing a plurality of spaced apart metal strips formed on a substrate and aligned transversely with respect to a path of a contact member, said metal strips in contact with a resistive material;

providing a group of said metal strips with strip extensions toward at least one side of the resistor track and wherein a plurality of said strip extensions intersect with corresponding ones of said metal strips, adjacent ones of said extensions connected by an adjusting resistor;

providing a slider track aligned transversely with respect to the path of the contact member, the slider track having a defined longitudinal width and being located in parallel to the plurality of spaced apart metal strips, wherein the contact member is in electrical contact with the slider track and the plurality of metal strips over its path, and adjusting a resistence by isolating said adjusting resistors.

6. The method of claim 5, wherein the step of cutting the isolating resistor regions comprises irradiating the isolating resistor regions with a laser light.

* * * * *